(12) United States Patent
Hille

(10) Patent No.: US 12,029,313 B2
(45) Date of Patent: Jul. 9, 2024

(54) ELECTROMOTIVE ADJUSTING DEVICE FOR A PIECE OF FURNITURE, IN PARTICULAR A PIECE OF TABLE FURNITURE

(71) Applicant: DewertOkin Technology Group Co., Ltd, Jiaxing (CN)

(72) Inventor: Armin Hille, Bielefeld (DE)

(73) Assignee: DewertOkin Technology Group Co., Ltd, Jiaxing (CN)

( * ) Notice: Subject to any disclaimer, the term of this patent is extended or adjusted under 35 U.S.C. 154(b) by 312 days.

(21) Appl. No.: 17/612,809

(22) PCT Filed: May 20, 2020

(86) PCT No.: PCT/EP2020/064054
§ 371 (c)(1),
(2) Date: Nov. 19, 2021

(87) PCT Pub. No.: WO2020/234343
PCT Pub. Date: Nov. 26, 2020

(65) Prior Publication Data
US 2022/0240668 A1   Aug. 4, 2022

(30) Foreign Application Priority Data
May 20, 2019   (DE) ...................... 20 2019 102 842.4

(51) Int. Cl.
  *A47B 13/00*   (2006.01)
  *H05K 1/18*    (2006.01)
  *H05K 7/14*    (2006.01)

(52) U.S. Cl.
  CPC ...... *A47B 13/00* (2013.01); *A47B 2200/0035* (2013.01); *H05K 1/181* (2013.01); *H05K 7/1427* (2013.01); *H05K 2201/10151* (2013.01)

(58) Field of Classification Search
  CPC ............ A47B 13/00; A47B 2200/0035; A47B 2200/0059; A47B 2200/006; A47B 9/00;
  (Continued)

(56) References Cited

U.S. PATENT DOCUMENTS 6,286,441 B1 *  9/2001  Burdi ....................... A47B 9/00
                                                       108/147
2006/0266791 A1 * 11/2006  Koch ....................... B25H 1/16
                                                        228/1.1
(Continued)

FOREIGN PATENT DOCUMENTS

| DE | 102006013349 | * | 9/2007 |
| DE | 202010005411 |   | 8/2011 |
| DE | 102011050159 |   | 11/2011 |

OTHER PUBLICATIONS

DE102006013349 English translation (Year: 2007).*
International Search Report issued by the European Patent Office International Application PCT/EP2020/064054.

*Primary Examiner* — Janet M Wilkens
(74) *Attorney, Agent, or Firm* — Henry M. Feiereisen LLC

(57) ABSTRACT

An electromotive adjusting device for a piece of furniture, in particular a piece of table furniture, includes a drive unit for adjusting a movable furniture part, and a control device for actuating the drive unit. The control device is configured for fastening to the movable furniture part. A sensor is arranged within a housing of the control device in order to detect a deformation of the furniture part and to switch off the drive unit when deformation is detected. Provision is made for a transmission element which is in contact with the furniture part and transmits the deformation of the furniture part to the sensor.

9 Claims, 4 Drawing Sheets

(58) Field of Classification Search
CPC ........ A47B 9/20; H05K 1/181; H05K 7/1427; H05K 2201/10151
USPC .................................................. 108/20, 147
See application file for complete search history.

(56) References Cited

U.S. PATENT DOCUMENTS

| | | | |
|---|---|---|---|
| 2011/0061570 A1* | 3/2011 | Klinke | F16H 25/2021 310/68 B |
| 2011/0168064 A1* | 7/2011 | Jahnsen | A47B 13/021 108/147 |
| 2018/0031441 A1* | 2/2018 | Wong | H01H 13/28 |

* cited by examiner

ELECTROMOTIVE ADJUSTING DEVICE FOR A PIECE OF FURNITURE, IN PARTICULAR A PIECE OF TABLE FURNITURE

CROSS-REFERENCES TO RELATED APPLICATIONS

This application is the U.S. National Stage of International Application No. PCT/EP2020/064054, filed May 20, 2020, which designated the United States and has been published as International Publication No, WO 2020/234343 A1 and which claims the priority of German Patent Application, Serial No. 20 2019 102 842.4, filed May 20, 2019, pursuant to 35 U.S.C. 119(a) (d).

BACKGROUND OF THE INVENTION

The invention relates to an electromotive adjusting device for a piece of furniture, in particular a piece of table furniture, having at least one drive unit for adjusting a movable furniture part. The adjusting device comprises a control device for actuating the at least one drive unit, wherein the control device is set up for attachment to the movable furniture part, and a sensor is arranged inside a housing of the control device in order to detect deformation of the furniture part and to switch off the drive unit when deformation is detected.

Electromotive adjusting devices are used in a wide variety of embodiments to move furniture parts that are hinged to a piece of furniture. Examples are an inclination or height adjustment of sections of a bed or other seating or reclining furniture or a height adjustment of a table top.

Since the drive units of the adjusting devices are designed to adjust the furniture part even under load, forces act which could lead to injury or destruction of the objects or the furniture in the event of a body part or other object becoming trapped. To prevent this, an anti-trapping device is often provided which, when a case of trapping is detected, switches off the drive unit or first allows it to run briefly in an opposite direction and then switches off. A known anti-trapping device is implemented, for example, via contact switches or switching strips arranged at sections of the furniture part where trapping can potentially occur and which are triggered by body parts or objects. Particularly in the case of height-adjustable tables, In which the table top constitutes the movable furniture part, it is costly to provide the entire table top, for example along its circumference, with switching strips. In addition, the switching strips interfere or may interfere with the design of the table furniture.

The publication DE 10 2011 050 159 A1 describes an alternative anti-trapping device in which a deformation of the furniture part, for example of the table top, is itself detected in order to detect a case of trapping. For this purpose, in a preferred design, a planar piezoelectric sensor is applied to the surface of the furniture part. A deformation of the furniture part can be detected by the sensor and interpreted as a case of trapping. In this case, the sensor is surrounded by a housing which has a recess at the position of the sensor so that the sensor directly contacts the furniture part. As an alternative, it is described in said publication to apply the piezo sensor directly from inside the housing to a housing base, wherein the housing base rests flat on the furniture part. This design simplifies the installation of the sensor unit, but the sensitivity of the sensor is reduced, which means that a case of trapping can no longer be detected with the required reliability.

It is therefore an object of the present invention to describe an electromotive adjusting unit of the type mentioned at the beginning, which is easy to install including the anti-trapping device via the sensor and which can nevertheless detect a case of trapping with a high degree of certainty.

SUMMARY OF THE INVENTION

This object is solved by an electromotive adjusting device having the features of the independent claim. Advantageous designs and further developments are the subject matter of the dependent claims.

An adjusting device according to the invention is characterized in that a transmission element is provided, which is in contact with the furniture part and transmits a deformation of the furniture part to the sensor.

By means of the transmission element, a deformation of the furniture part can be transmitted to the sensor without the sensor having to be positioned in or on the housing in such a way that the sensor itself can directly detect the deformation of the furniture part. This simplifies the structure of the adjusting device and, in particular, the arrangement of the sensor within the housing of the adjusting device.

In an advantageous design of the adjusting device, a section of the housing is designed as a transmission section. The design of a section of the housing as a transmission section, which contacts the furniture part and transmits deformations to the sensor, ensures that a sensor arranged inside the housing can also detect deformations of the furniture part with the required sensitivity. The transmission section can have, for example, a sensing element (sensing probe) which contacts the furniture part.

In a further advantageous design of the adjusting device, the transmission section may thus be a section of the housing which is formed as a spring tongue and is connected to adjacent regions of the housing only in a part of its circumference. Preferably, the transmission section may thereby be integrally formed, for example from a casting, with the housing part. The one-piece integral design allows for low-cost manufacturing and easy assembly.

In an alternative embodiment, the transmission element is formed as a separate component and is associated with the housing.

Preferably, it is attached to the housing. However, it can also be provided that the transmission element is guided through an opening of the housing at least in sections and contacts the furniture part with a first region. A second region of such a transmission element is designed to transmit a deformation of the furniture part to the sensor.

In a further advantageous design of the electromotive adjusting unit, the sensor is arranged directly on a printed circuit board in the housing of the control device. This simplifies the structure of the control device, which can be produced at a correspondingly lower cost. Preferably, the printed circuit board on which the sensor is arranged also has control elements for driving the at least one drive unit, i.e. is the or one of the main printed circuit boards of the control device, which is provided in any case. Thus, there is no need for an additional printed circuit board or other mounting means for the sensor. Suitable control elements are relay switches, semiconductor switches as well as its actuation means such as processors or controllers.

In a further advantageous design of the electromotive adjusting device, the sensor operates capacitively and interacts in a contactless manner with the transmission section. Alternatively, the sensor may operate inductively and interact in a contactless manner with the transmission element, for example the transmission section, or a ferromagnetic, paramagnetic or diamagnetic element arranged on the transmission element or section. As a further alternative, the sensor may operate piezoelectrically and/or comprise strain gauge elements, in which case it is directly or indirectly mechanically coupled to the transmission element.

Furthermore, the sensor may be a ring coil which is arranged on the printed circuit board and through the opening of which a fastening element, for example a fastening screw, passes, with which the control device is fastened to the movable furniture part. The printed circuit board is thereby held within the housing in a region which is adjacent to the transmission element. In this way, a deformation of the furniture part is transmitted into a relative movement between the ring coil and the fastening element, which changes an inductance of the ring coil, which in turn can be detected.

In a further advantageous design of the electromotive adjusting device, it is provided that in the unmounted state of the adjusting device in the furniture, the transmission element protrudes beyond outer limits of the housing. This ensures that, after the control device has been mounted on the furniture part or in the furniture, the transmission section or the transmission element is always slightly pretensioned and transmits this pretension to the sensor to a small extent. In particular, this ensures a play-free coupling and transmission of movement from the furniture part to the sensor. The amount of protrusion or the geometric amount of pretension can be between about 0.5 millimeters (mm) and about 3 mm.

The functional and procedural sequence of the arrangement, in particular a height-adjustable table designed as electromotive furniture, is now as follows: During the vertical adjustment process, an undesirable operating situation may occur. If the table top moves against a stationary object or against a body part, the table top deforms by a certain amount. Since the fastenings of the control housing to the furniture part or to the table top are spaced relatively far apart from one another, and the transmission section or the transmission element is arranged at a distance from the fastening points, a relatively large movement of the transmission section or the transmission element takes place even in the case of even small deformations of the table top, which in turn leads to a good detection capability of the sensor. The sensor is electrically coupled to an evaluation device, which has a controller with a program that can run on it. The program has a process step which classifies only rapidly changing signals at the sensor output as an undesirable operating situation mentioned at the beginning, and then switches off all motors immediately. After all motors have been switched off, the at least one electric motor can be operated automatically in the reverse direction of rotation in a further process step. The duration of this operation may be limited in time and may be, for example, 0.5 to 1 second.

BRIEF DESCRIPTION OF THE DRAWING

The invention is explained in more detail below with reference to exemplary embodiments with the aid of figures. The figures show as follows.

DETAILED DESCRIPTION OF PREFERRED EMBODIMENTS

Figure 1:
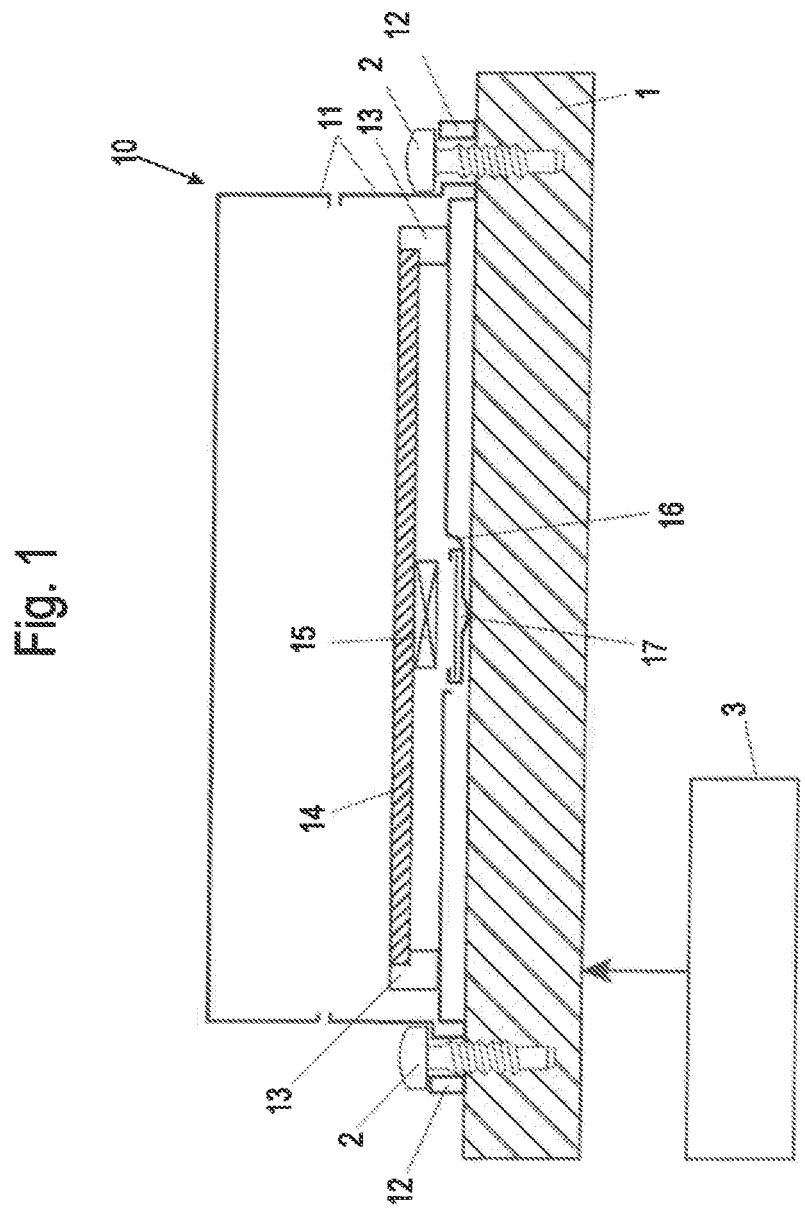
FIG. 1 shows a schematic representation of a control device mounted on a piece of furniture in a first embodiment.

The figures described below each show an exemplary embodiment of a control device of an electromotive adjusting device in a schematic sectional drawing. In all exemplary embodiments, the same reference signs indicate the same or similarly acting elements.

In all exemplary embodiments, a control device 10 is shown mounted on a furniture part 1. The furniture part is, for example, a table top which is height-adjustable by means of the electric motor-driven adjusting device. The electromotive adjusting device then includes at least one drive unit 3, and in the case of height-adjustable tables usually two drive units 3, which may be in the form of lifting columns, for example, on which the table top is mounted as the furniture part 1. The drive units 3 are connected to the control device 10, as is a power supply cable. Typically, an operating unit is also provided which is coupled to the control device 10 via a cable or wirelessly and via which the control device 10 can be instructed to activate the drive units.

In all of the exemplary embodiments shown, the control device 10 comprises a housing 11, which in each of the examples shown is formed in two parts and comprises a lower housing part and an upper housing part. In all cases, an integral housing or also a multi-piece housing could also be used. The housing 11 has at least one housing foot 12, through each of which a fastening screw 2 passes, with which the control device 10 is fastened to the furniture part 1. In the exemplary embodiments of FIGS. 1 to 3, at least two housing feet 12 and fastening screws 2 are provided in each case, which are arranged on opposite sides of the housing 11 of the control device 10. Due to this type of fastening, the housing 11 with the housing feet 12 rests firmly on the furniture part 1, for example the table top.

A printed circuit board 14 is arranged inside the housing 11, which rests in a known manner on printed circuit board receptacles 13. Such printed circuit board receptacles 13 support the printed circuit board 14 at a plurality of, at least three and typically four or more, support points. The printed circuit board receptacles 13 may preferably be integrally formed with the housing 11 in an injection-molding process. In the region of the printed circuit board receptacles 13 or separately therefrom, tabs with latching lugs may be provided which engage over the printed circuit board 14 and thus enable quick and uncomplicated assembly of the printed circuit boards 14 in the housing 11.

In the exemplary embodiment of FIG. 1, a sensor 15 is arranged on an underside of the printed circuit board 14, I.e. on a side facing the furniture part 1, which in the exemplary embodiment of FIG. 1 is an inductive or capacitive sensor. A coil or also a Hall sensor can be used as an inductive sensor.

The sensor 15 is preferably arranged as a component on the printed circuit board 14. Advantageously, there is no further attachment of the sensor 15, so that the sensor 15 can be arranged on the printed circuit board 14 in the usual assembly process that the printed circuit board 14 undergoes. If a coil is used, this may be a separate component positioned on the printed circuit board. However, the coil may also be a planar coil formed by conductor tracks of the printed circuit board 14. In one design as a capacitively operating sensor 15, conductor tracks of the printed circuit board 14 may themselves form the sensor 15. In the case of a capacitively operating proximity sensor, for example, conductor tracks arranged next to each other and possibly interlocked in a comb-like manner can be used as electrodes of the sensor 15.

Immediately in the region of the sensor 15, a section 16 of the housing 11 is adapted to receive a deformation of the furniture part 1 and to transmit it to the sensor 15. This section 16 is hereinafter also referred to as the transmission section 16 and constitutes a transmission element. It comprises a sensing element 17 which projects down to the furniture part 1. In the exemplary embodiment of FIG. 1, the transmission section 16 is formed as a spring tongue which is separated from the surrounding area of the housing 11 along a large part of its circumference by a gap and is connected to the remaining part of the housing 11 only in a connecting section which may, for example, be formed by one or more webs. The connecting section may be formed in a cranked shape to allow the transmission section 16 to protrude towards the furniture part 1. Alternatively, a larger area of the bottom of the housing 11 may be exposed to position the transmission section 16 closer to the furniture part 1. Alternatively, the transmission section 16 may be arranged in the same plane as the surrounding area of the housing 11, in which case a correspondingly long sensing element 17 is used.

When an inductive sensor 15 is used, a ferromagnetic or paramagnetic element, or optionally a permanent magnetic element, may be arranged on an upper side of the transmission section 16 facing in the direction of the printed circuit board 14, for example.

During operation of the control device 10, a case of trapping, I.e. in an undesirable operating situation, leads to a deformation, for example bending or twisting of the furniture part 1. As a result, the relative position of the surface of the furniture part 1 in the region of the sensor 15 changes with respect to its position in the region of the housing feet 12. This change is transmitted by the sensing element 17 to the transmission section 16. The sensor 15 detects a change in position of the transmission section 16 in a capacitive or inductive manner by changing the electrical (in the capacitive case) or the paramagnetic or diamagnetic (in the inductive case) environment of the sensor 15. Here, changes are particularly relevant which, on the one hand, can be detected better than absolute values and which, on the other hand, mask out a different initial position of the sensing element 17 depending on the mounting situation and surface properties of the furniture part 1.

Figure 2:
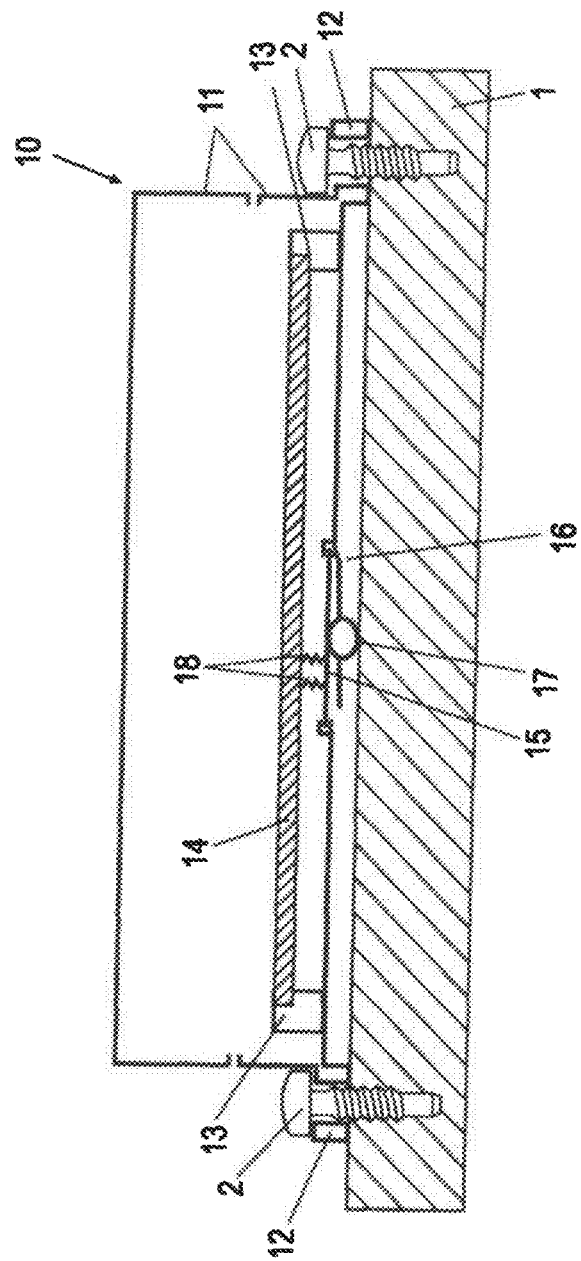
FIG. 2 shows a schematic representation of a control device mounted on a piece of furniture in a second embodiment.

FIG. 2 shows a further exemplary embodiment of a control device 10. With regard to the construction of the housing 11 and the arrangement of the printed circuit board 14, the second exemplary embodiment corresponds to the first, the description of which is hereby explicitly referred to.

In contrast to the first exemplary embodiment, the example of FIG. 2 uses a piezoelectric sensor 15. A further difference is that the sensor 15 is not arranged directly on the printed circuit board 14, but is inserted into a receptacle of the housing 11, which is located in the region of the transmission section 16. In order to achieve the simplest possible assembly of the control device 10 also in this case, contacting of the sensor 15 is effected via contact springs 18, which may either be attached to the sensor 15 or to the printed circuit board 14. When the control device 10 is assembled, the sensor 15 is thus contacted by the printed circuit board 14 without the need to make cable connections. The sensing element 17 is designed to contact the furniture part 1 on the one hand, and a surface of the sensor 15 on the other hand. In order to be even more variable with regard to the basic position of the sensing element 17, it may be provided in an alternative design that the sensing element 17 projects up to the furniture part 1 and, from the transmission section 16, a separate, preferably resilient, element presses on the sensor 15 and a movement of the sensing element 17 takes place via the transmission section 16 and this separate element.

Figure 3:
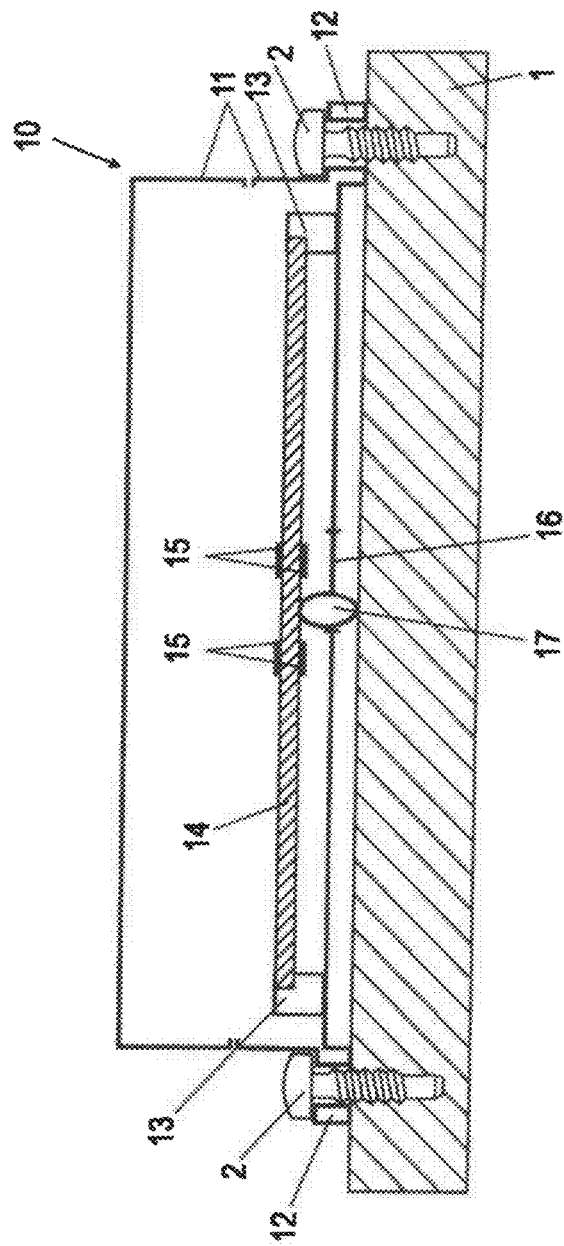
FIG. 3 shows a schematic representation of a control device mounted on a piece of furniture in a third embodiment.

FIG. 3 shows a third exemplary embodiment. In this example, similar to the example in FIG. 1, the sensor 15 is mounted directly on the printed circuit board 14. Strain gauges are used as sensor 15 in the exemplary embodiment of FIG. 3, preferably four strain gauges are used which can be evaluated in a bridge circuit. A deformation of the furniture part 1 is transmitted via the sensing element 17 and the transmission section 16 to the printed circuit board 14, which also deforms accordingly, which is detected by the sensor 15.

Figure 4:
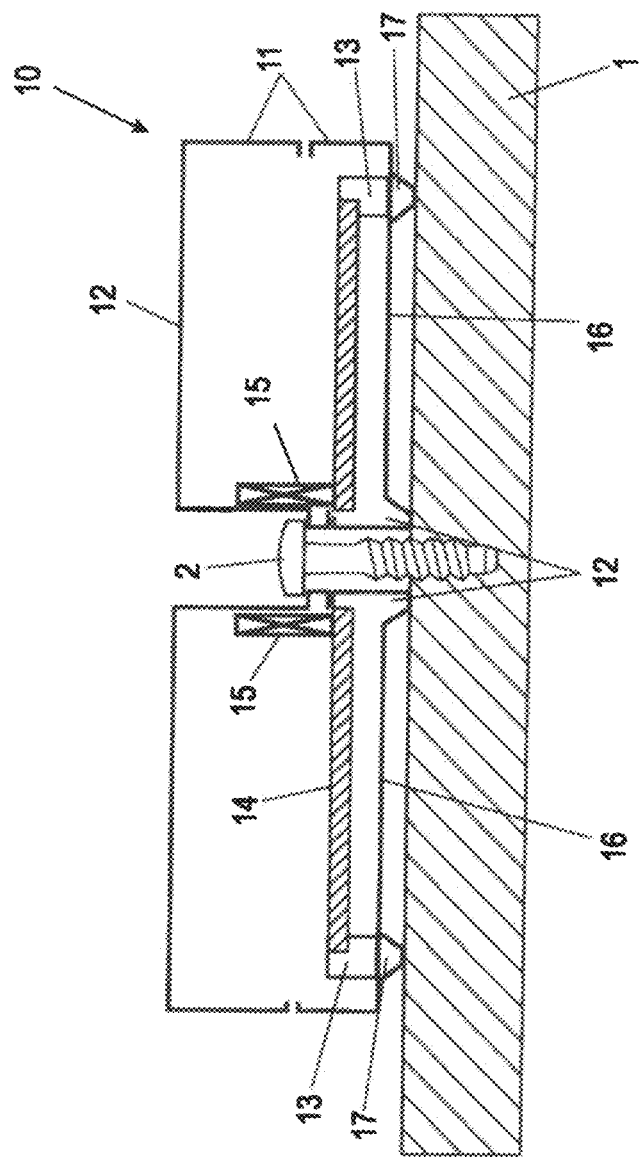
FIG. 4 shows a schematic representation of a control device mounted on a piece of furniture in a fourth embodiment.

FIG. 4 shows a further exemplary embodiment of a control device 10. In this case, a central fastening to the furniture part 1 is provided with only one fastening screw 2, which passes through a central housing foot 12. In this region, the housing foot 12 and also the fastening screw 2 also penetrate the printed circuit board 14, which is recessed accordingly. Otherwise, as before, the printed circuit board 14 is retained in an outer region by means of printed circuit board receptacles 13. The printed circuit board 14 is not fixed to the housing 11 in the central area.

In the outer area of the housing 11, further support points of the housing on the furniture part 1 are provided, which represent sensing elements 17 within the terms of the application.

As a sensor 15, a ring coil is centrally arranged on the printed circuit board 14, which surrounds the housing section through which the fastening screw 2 passes.

When the furniture part 1 is deformed, the position of the sensing elements 17 at the edge of the housing 11 changes with respect to the centrally arranged housing foot 12. Accordingly, the printed circuit board 14 is raised or lowered with respect to the housing foot 12. With the movement of the printed circuit board 14 relative to the housing foot 12 and the fastening screw 2, the position of the ring coil as sensor 15 relative to the housing foot 12 and in particular the fastening screw 2 also changes. This change leads to a change in the inductance of the ring coil, which can be detected. Preferably, the ring coil is part of a resonant circuit whose resonant frequency is detected. A change in the relative position of the ring coil to the fastening screw 2 leads to a change in the resonant frequency, which indicates a case of trapping. For example, if the change in frequency exceeds a predetermined value, this may be considered to be a case of trapping and the control device 10 stops all running drive units or allows them to run in the opposite direction for a short time before stopping them thereafter.

What is claimed is:
1. An electromotive adjusting device for adjusting a movable furniture part of a piece of furniture, comprising:
   a drive unit;
   a control device attachable to the movable furniture part and configured to actuate the drive unit, said control device including a housing;

a printed circuit board arranged in the housing and comprising a control element for actuating the drive unit;

a sensor arranged inside the housing directly on the printed board and configured to detect a deformation of the furniture part and to switch off the drive unit when the deformation is detected; and a transmission element disposed on the housing and configured to transmit the deformation of the furniture part to the sensor.

2. The electromotive adjusting device of claim 1, wherein the transmission element is formed as a spring tongue which is connected to adjacent areas of the housing only in a part of a circumference of the spring tongue.

3. The electromotive adjusting device of claim 1, wherein the sensor operates capacitively and interacts with the transmission element without contact.

4. The electromotive adjusting device of claim 1, wherein the sensor operates piezoelectrically and/or comprises a strain measuring element.

5. The electromotive adjusting device of claim 1, wherein the sensor operates inductively and interacts without contact with the transmission element or with a ferromagnetic, paramagnetic or diamagnetic element arranged on the transmission element.

6. The electromotive adjusting device of claim 1, wherein the transmission element protrudes beyond an outer limit of the housing in a non-assembled state of the adjusting device.

7. The electromotive adjusting device of claim 1, wherein the piece of furniture is a piece of table furniture.

8. An electromotive adjusting device for adjusting a movable furniture part of a piece of furniture, comprising:
a drive unit;
a control device attachable to the movable furniture part and configured, to actuate the drive unit, said control device including a housing comprising a printed circuit board arranged in the housing;
a sensor arranged inside the housing directly on the printed circuit board and configured to detect a deformation of the furniture part and to switch off the drive unit when the deformation is detected; and
transmission element configured to transmit the deformation of the furniture part to the sensor,
wherein the sensor is embodied as a ring coil which is disposed on the printed circuit board and configured for passage of a fixing screw, said printed circuit board being retained within the housing in a region adjacent to the transmission element.

9. The electromotive adjusting device of claim 8, wherein the piece of furniture is a piece of table furniture.

* * * * *